(12) United States Patent
Tsai

(10) Patent No.: US 6,655,970 B2
(45) Date of Patent: Dec. 2, 2003

(54) CONNECTING SOCKET AND TERMINAL STRUCTURE THEREOF

(76) Inventor: Tien-Ching Tsai, No. 28, Wu-Chuan 8 Rd. Wu-Ku Hsiang, Taipei Hsien (TW)

(*) Notice: Subject to any disclaimer, the term of this patent is extended or adjusted under 35 U.S.C. 154(b) by 0 days.

(21) Appl. No.: 10/098,407

(22) Filed: Mar. 18, 2002

(65) Prior Publication Data

US 2003/0176096 A1 Sep. 18, 2003

(51) Int. Cl.[7] ............................................. H01R 13/44
(52) U.S. Cl. ...................................... 439/135; 439/342
(58) Field of Search ........................... 439/33, 135, 342, 439/940

(56) References Cited

U.S. PATENT DOCUMENTS 4,671,587 A * 6/1987 Lerner et al. ............... 439/142
6,116,949 A * 9/2000 Costello et al. ............. 439/509
6,155,848 A * 12/2000 Lin ............................. 439/135

* cited by examiner

Primary Examiner—Khiem Nguyen
(74) Attorney, Agent, or Firm—Rosenberg, Klein & Lee

(57) ABSTRACT

A connecting socket and a terminal structure thereof mainly comprises of a base, a handle, a movable cover, a protective cover, a holding tool, a plurality of terminals and a plurality of tin balls. A clipping clasp is set on the movable cover, and a space near the clipping rail of the base is extended inward form the edge such that the holding tool can be inserted to help the clipping clasp depart from the clipping rail to make the movable cover can be depart easily from the base; the incline or arc surrounding the protective cover can prevent the dust and miscellaneous article and washing liquid from attaching; an inclined staggered part is set at the other end of the terminal; moreover, a tin ball position part is extended from the lower portion of the terminal to perform multi-points soldering or clipping tightly tin balls and have better stability.

15 Claims, 14 Drawing Sheets

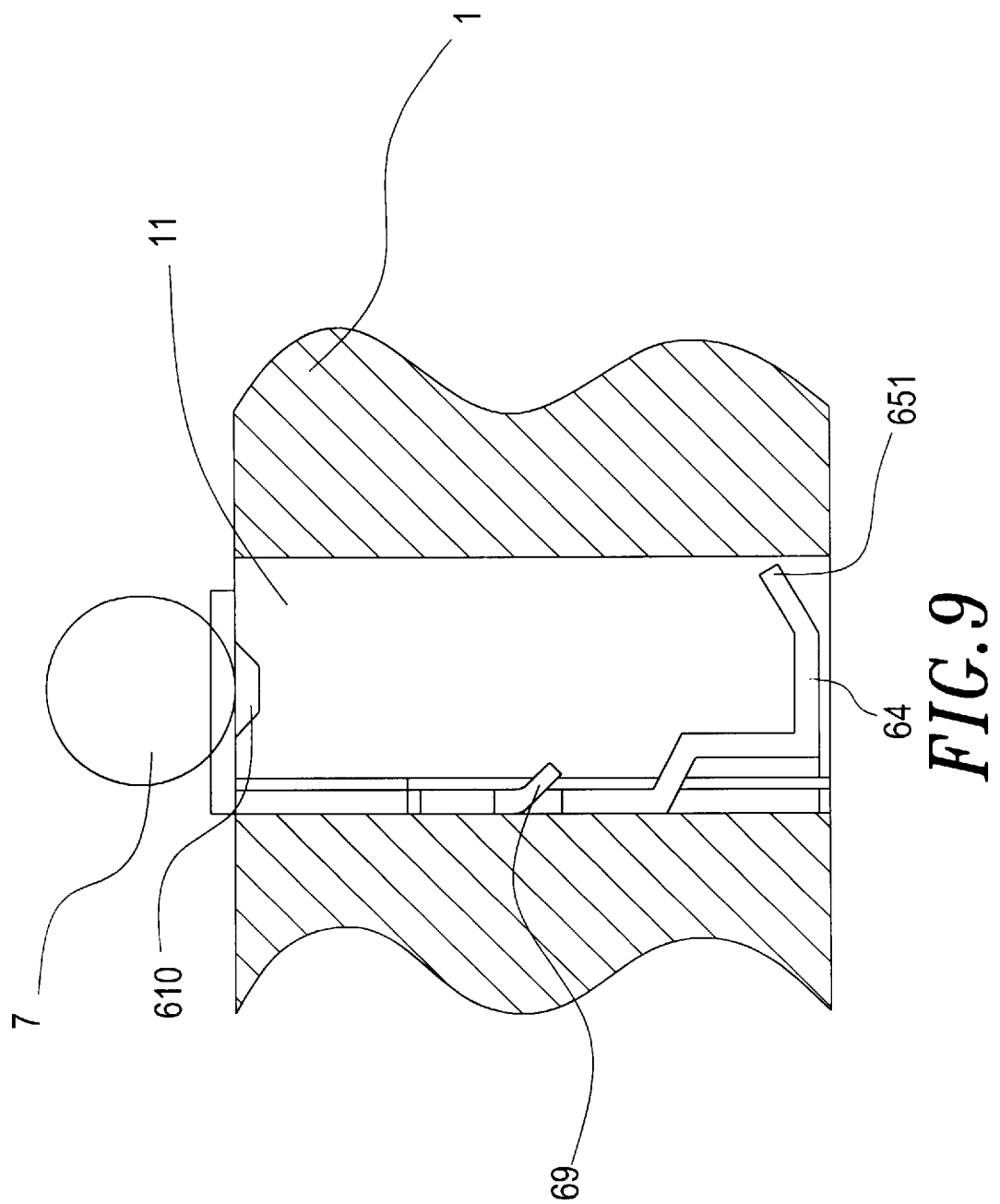

CONNECTING SOCKET AND TERMINAL STRUCTURE THEREOF

FIELD OF INVENTION

The present invention relates to a connecting socket and a terminal structure thereof, especially to a one in which an upper cover is detachable from a base. A shearing method is used between a connecting part of the terminal, a connecting arm and a connecting part of a material belt such that the connection has sufficient width and vertical bearing capability, then the connecting part and the contacting arm, the contacting part are separated. The contacting part is thereafter bent inward such that opposing contacting arms and contacting parts can be controlled to match desired size and clipping force to provide stable connections. In addition, there are enough positioning parts during soldering to ensure accurate position; therefore, the connecting socket and the terminal structure thereof yield reduced costs and increased efficiency.

DESCRIPTION OF THE PRIOR ART

A commonly known connecting socket 8 is shown in FIG. 1, FIG. 2, and FIG. 3. The connecting socket is composed of a base 81, and a movable cover 82, which have clipping surfaces 811, 821 to achieve steady combining effect. In typical applications, imperfect products are unavoidably produced during mass production. When the connecting socket 8 is welded on to the printed circuit board, it also may break down such that appropriate repair becomes necessary.

To effect such repair of the connecting socket 8, the base 81 and the movable cover 82 must first be separated from each other. The figures illustrate that the movable cover 82 may be disassembled by inserting a tool into repairing holes 822 of the clipping surfaces 821 along opposed sides. However, there are four clipping places 811 at the front end of the base 81 and repairing holes 812 arc too small to facilitate safe disassembly of the base. Although disassembly task can be performed from the bottom of the connecting socket 8, the base 81 and the movable cover 82 cannot be freely disassembled for cleaning or repairing analysis so long as the connecting socket 8 is welded onto the printed circuit board. Such access to the clipping places 811 from the bottom of the base 81 is blocked in that case. Effective use of the whole printed circuit board may thus be lost.

A protective cover 83 may be set above the movable cover 82, and a flat plane defined thereon can allow a vacuum device to position the connecting socket 8 on the printed circuit board for welding. However, the sides of the plane of the protective cover 83 are asymmetric, requiring the protective cover 83 to be oriented in a certain direction to be clipped on the movable cover 82. Therefore, the positioning process unduly requires much attention and care. Moreover, the configuration of the protective cover 83 is such that it cannot cover all guide holes 823 completely, and the surface thereon has many openings such that stray articles, dust, or other foreign matter may drop into the guide holes 823.

There are two known approaches of terminal contacts for the connecting socket 8. The first approach is illustrated in U.S. Pat. No. 6,099,321, "LOW PROFILE ZERO INSERTION FORCE SOCKET," and IP Patent No. 2,000,357,572, "ZIF TYPE SOCKET," which rids itself of unessential terminal material such that the remaining desired material is bent into desired shape to effect to surface contact. When the material of the terminal is expanded, the required material has to be larger than the interval distance of connecting sockets. In order to match the interval distance of the connecting sockets to assemble in a row, the interval distance between two continuous terminals has to be increased. In this way, the material and cost of the terminal are increased. The interval distance between two continuous terminals being greater than that of two continuous connecting sockets results in doubled production procedures and time, causing waste in materials, production time and costs.

The other terminal contact approach is section contact, as illustrated in FIG. 4, which utilizes a terminal 84 and a material belt 841 forming connecting and contacting parts 842 and 844. The length of the contacting part 844 is too small to serve as the connecting part after shearing because it will not provide sufficient bearing capability to withstand follow-up processes and carrying without deforming. In addition, when assembled, the terminals 84 must be pressed into the receiving holes of the base from the material belt 841. There is insufficient bearing capability such that deformation of the terminal and unsteady inset easily occur. Therefore, it is not ideal to utilize the end portion of the contacting part of the terminal with the connecting part 842. The connecting part 842 may also be covered with gold liquid during electroplating processes, causing gold liquid to be wasted.

SUMMARY OF THE INVENTION

A primary object of the present invention is to provide a connecting socket and terminal structure thereof wherein the space near a clipping rail is extended to a nearest side for passing through to make a clipping clasp of the movable cover within a line of vision, therethrough. A holding tool may be inserted into the space near the clipping rail such that the upper cover and the base can be disassembled to permit cleaning.

Another object of the present invention is to provide a connecting socket and terminal structure thereof, wherein a protective cover is set above the connecting socket, which is easy to install and which can cover completely the surface of the connecting socket. The middle of the protective cover defines a flat plane, which serves as the surface aspirated by a vacuum device for positioning the connecting socket. An incline or arc of an inclined arc part surrounding the flat plane is used to deflect away miscellaneous articles or objects and washing liquid.

Another object of the present invention is to provide a connecting socket and terminal structure thereof, wherein clipping claws at both sides of a bottom of a movable cover and pushing parts at both sides of a protective cover are opposite such that the protective cover can be assembled with the movable cover, and the protective cover can be detached from the movable cover after a handle is manipulated.

Another object of the present invention is to provide a connecting socket and terminal structure thereof, wherein a connecting part of the terminal becomes larger in size, and a contacting arm and contacting part are adapted for a manufacturing method of shearing such that the connecting part has enough bearing capability to receive a row of several terminals pressed tightly into the grooves of receiving holes of a base.

Yet another object of the present invention is to provide a connecting socket and terminal structure thereof wherein the connecting part of the terminal and the contacting arm are formed apart from each other to form a staggered space such that the pair of opposing connecting part and contacting arm can have good elastic effect.

Still another object of the present invention is to provide a connecting socket and terminal structure thereof, wherein a claw-type tin ball positioning part which can receive a tin ball steadily in cooperation with a clipping part of receiving holes of the base and can support a multi-point soldering method, is extended from a lower part of the terminal.

BRIEF DESCRIPTION OF THE DRAWINGS

The drawings disclose an illustrative embodiment of the present invention which serves to exemplify the various advantages and objects hereof, and are as follows:

FIG. 9A is a sectional view, partially out away, of the first exemplary embodiment of the terminal of the present invention having a varied incline or arc;

DETAILED DESCRIPTION OF THE PREFERRED EMBODIMENTS

Figure 1:
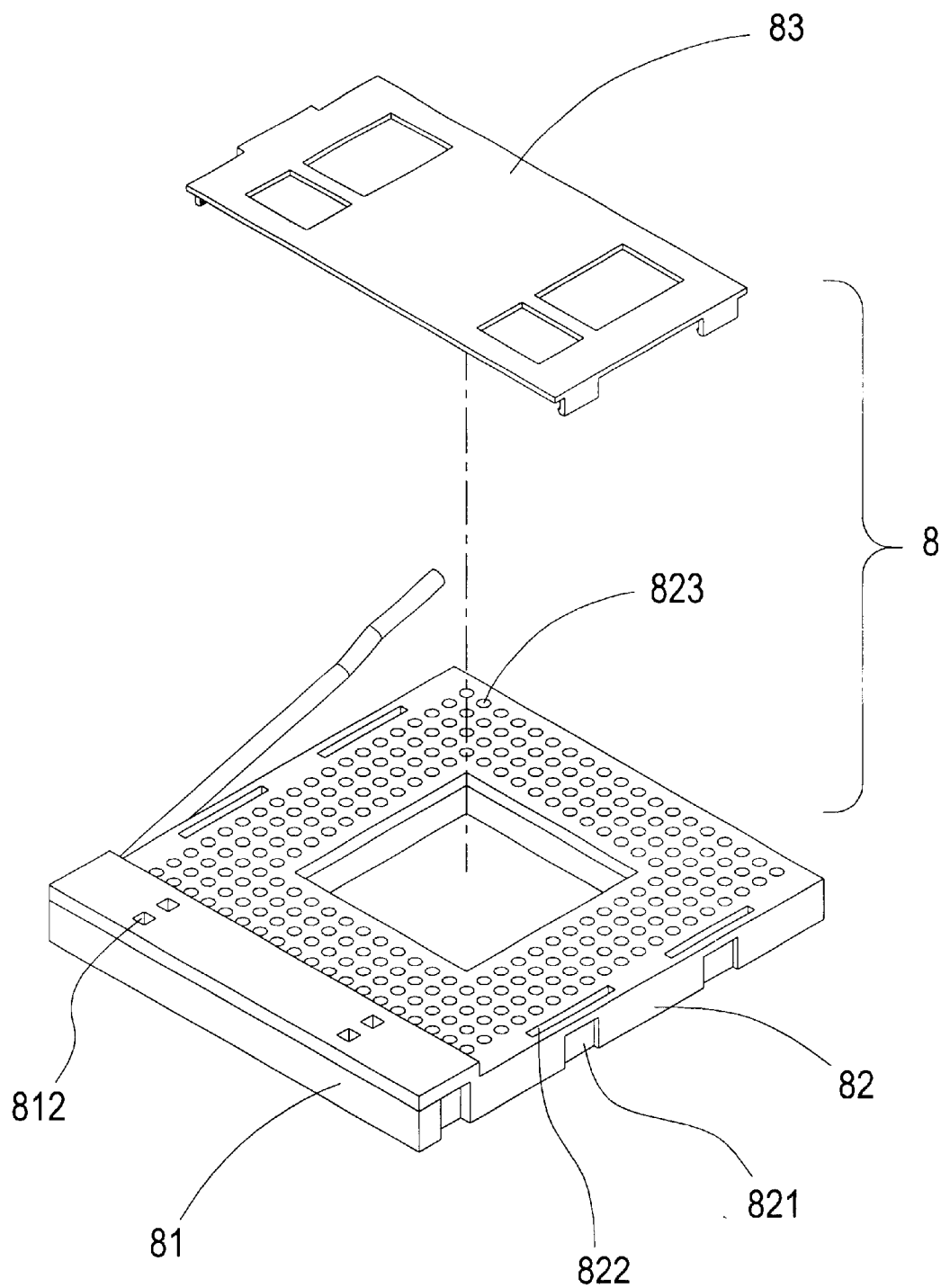
FIG. 1 is a perspective view of a commonly known connecting socket.
Figure 2:
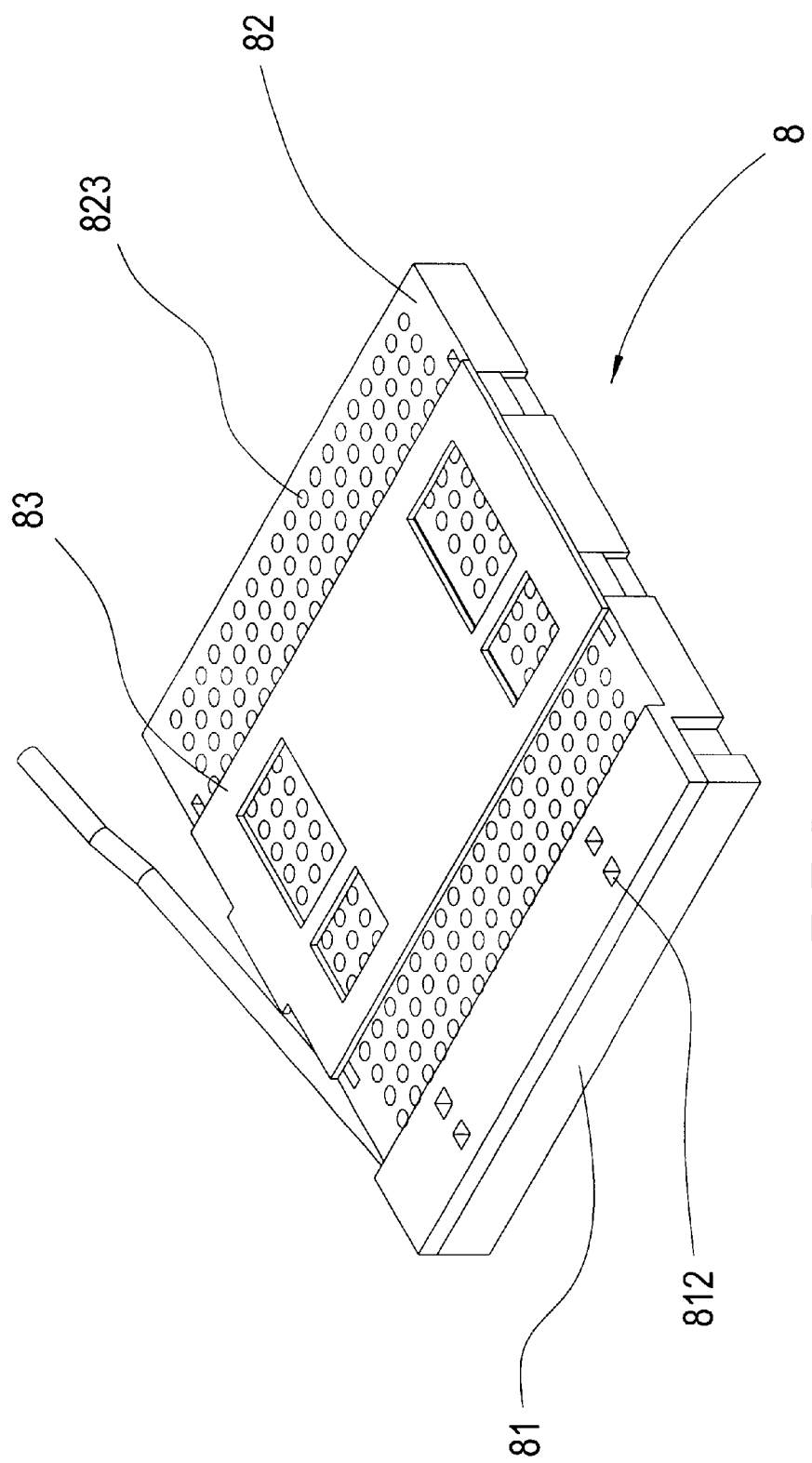
FIG. 2 is an assembled perspective view of the commonly known connecting socket and the protective cover.
Figure 3:
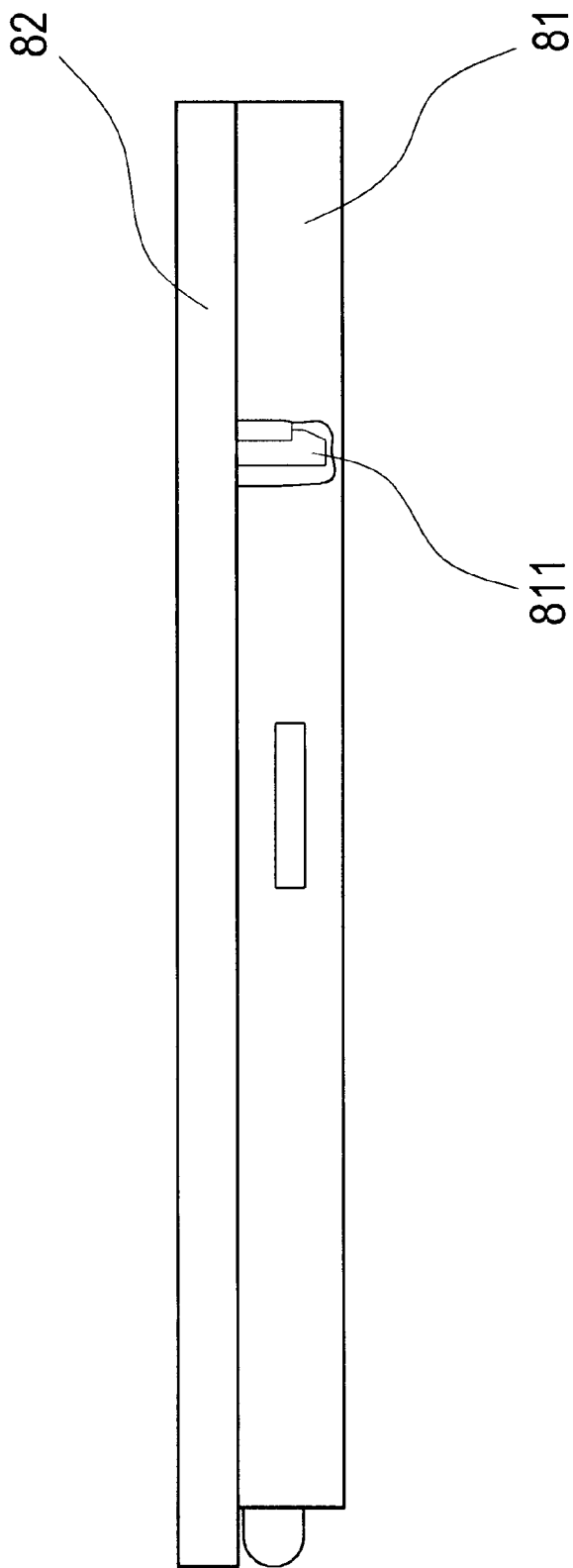
FIG. 3 is an end view of the commonly known connecting socket.
Figure 4:
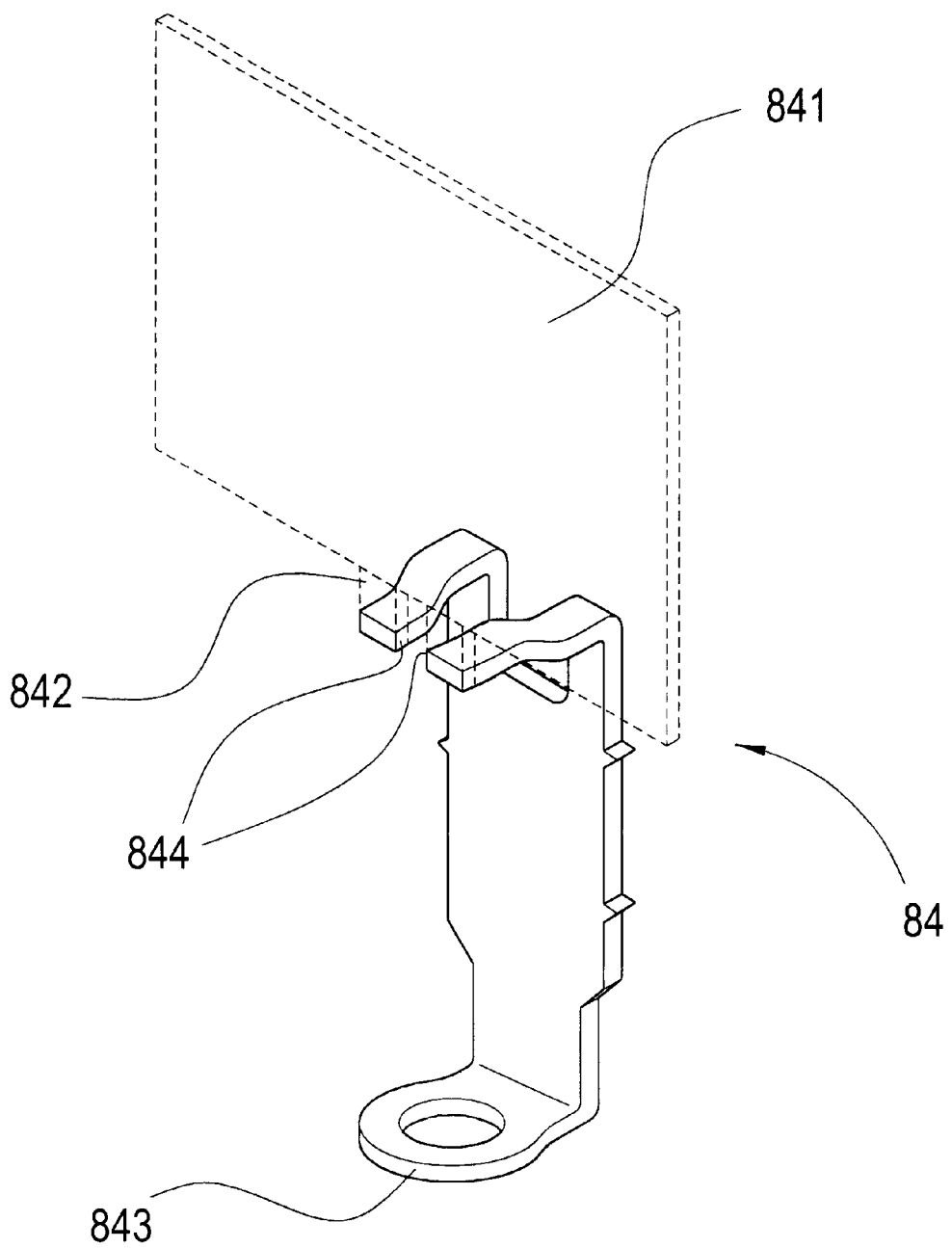
FIG. 4 is a schematic perspective view of an example of a commonly known terminal.
Figure 5:
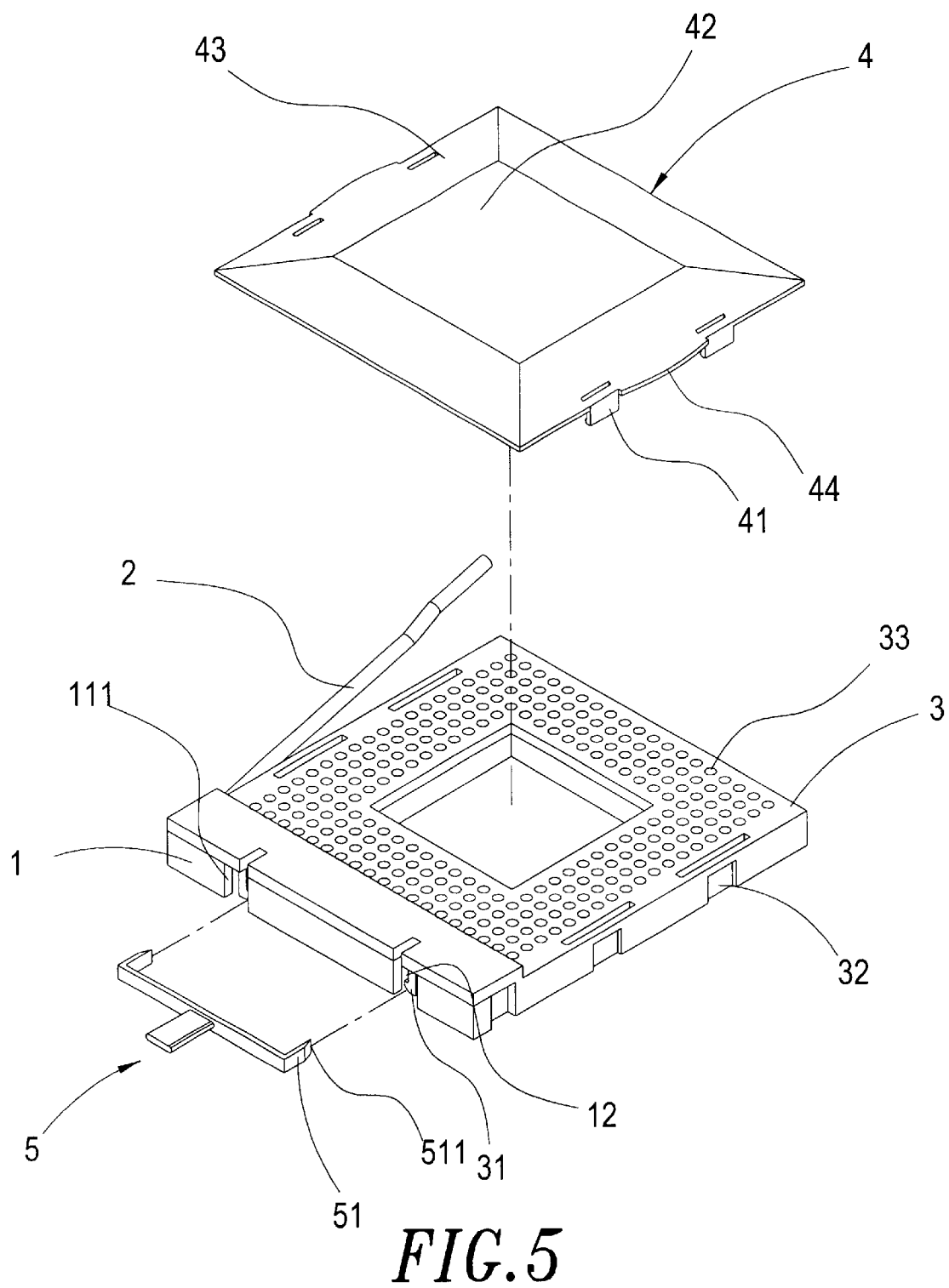
FIG. 5 is an exploded perspective view of an embodiment of the connecting socket of the present invention and a holding tool.
Figure 6:
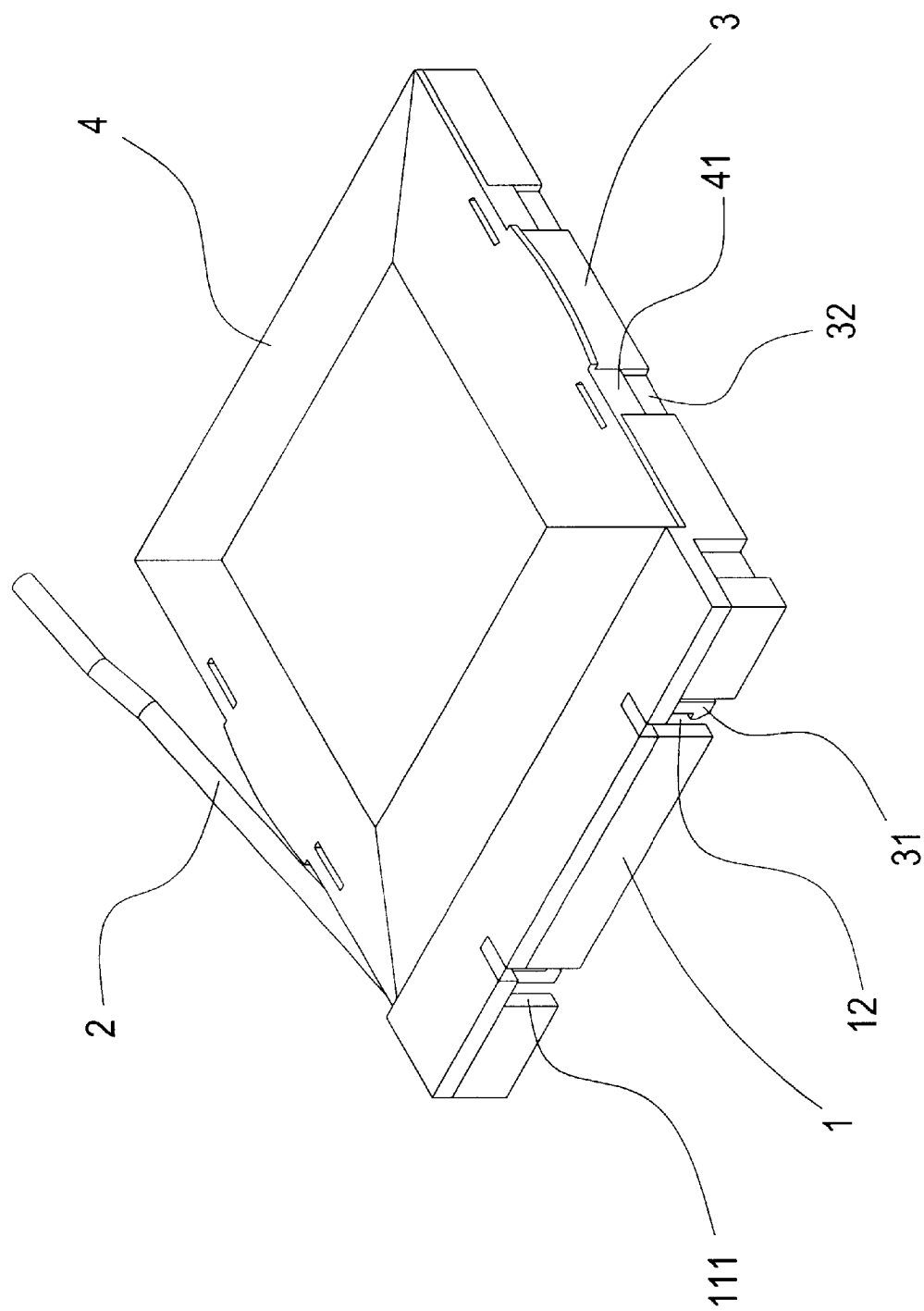
FIG. 6 is an assembled perspective view of an embodiment of the connecting socket of the present invention.
Figure 7:
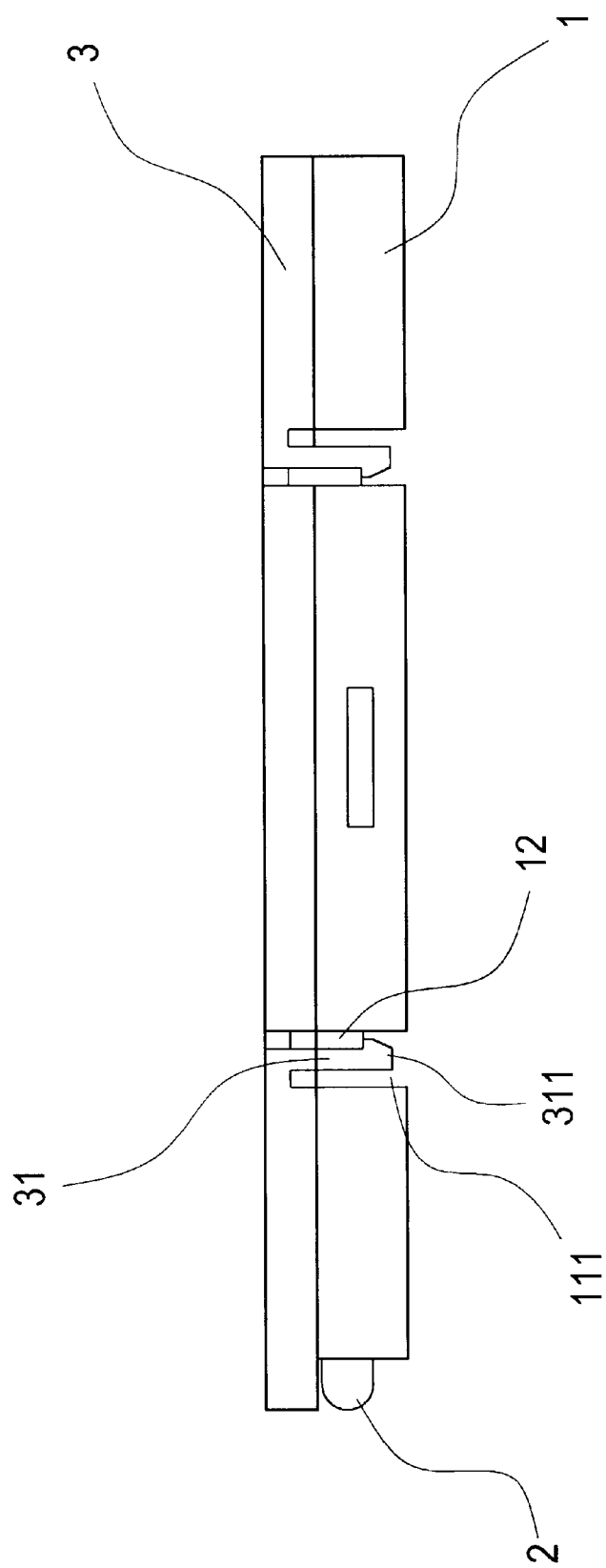
FIG. 7 is a lateral view of the embodiment of the connecting socket of the present invention.
Figure 8:
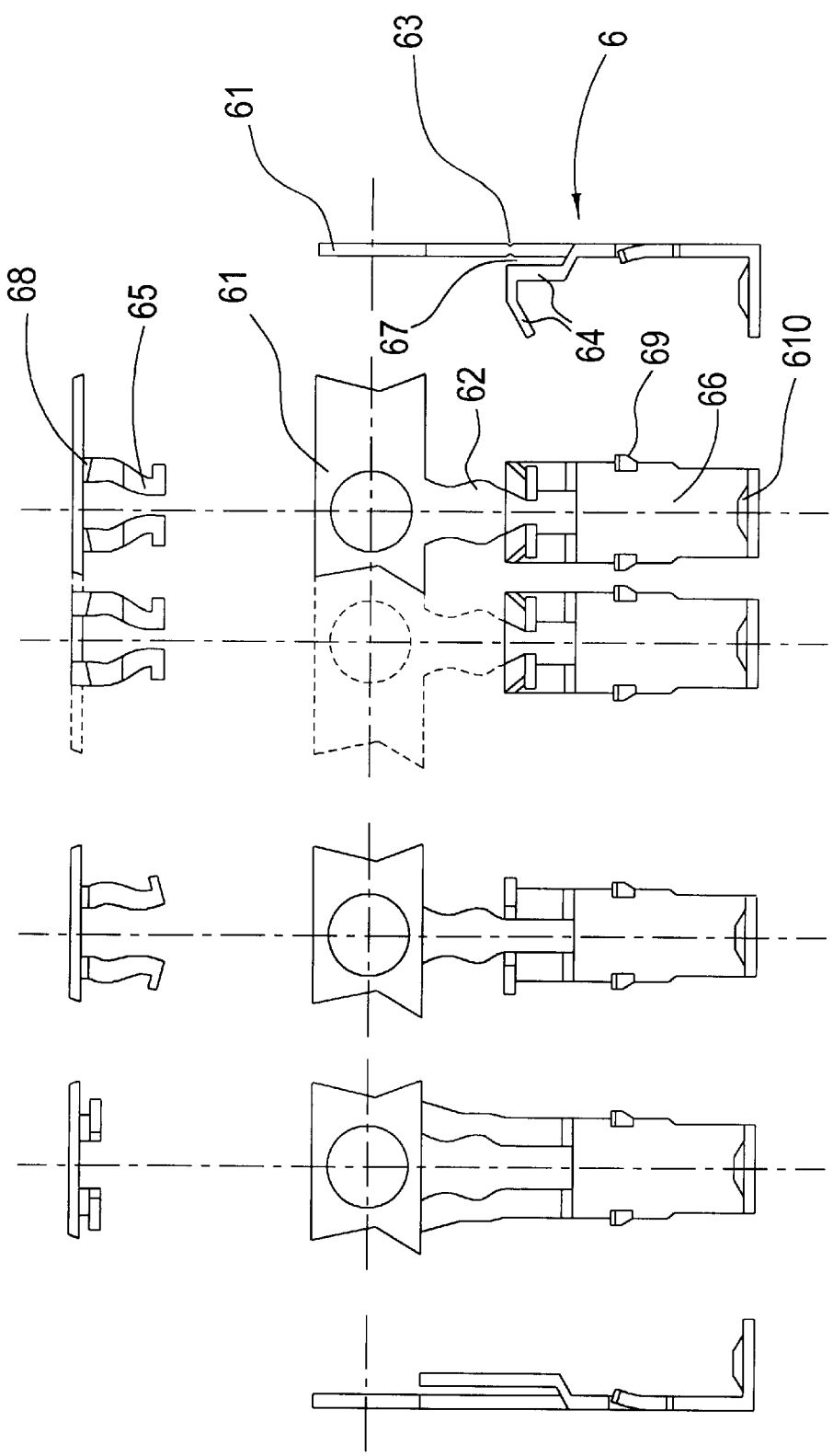
FIG. 8 is a first exemplary embodiment of the terminal of the present invention.
Figure 9:
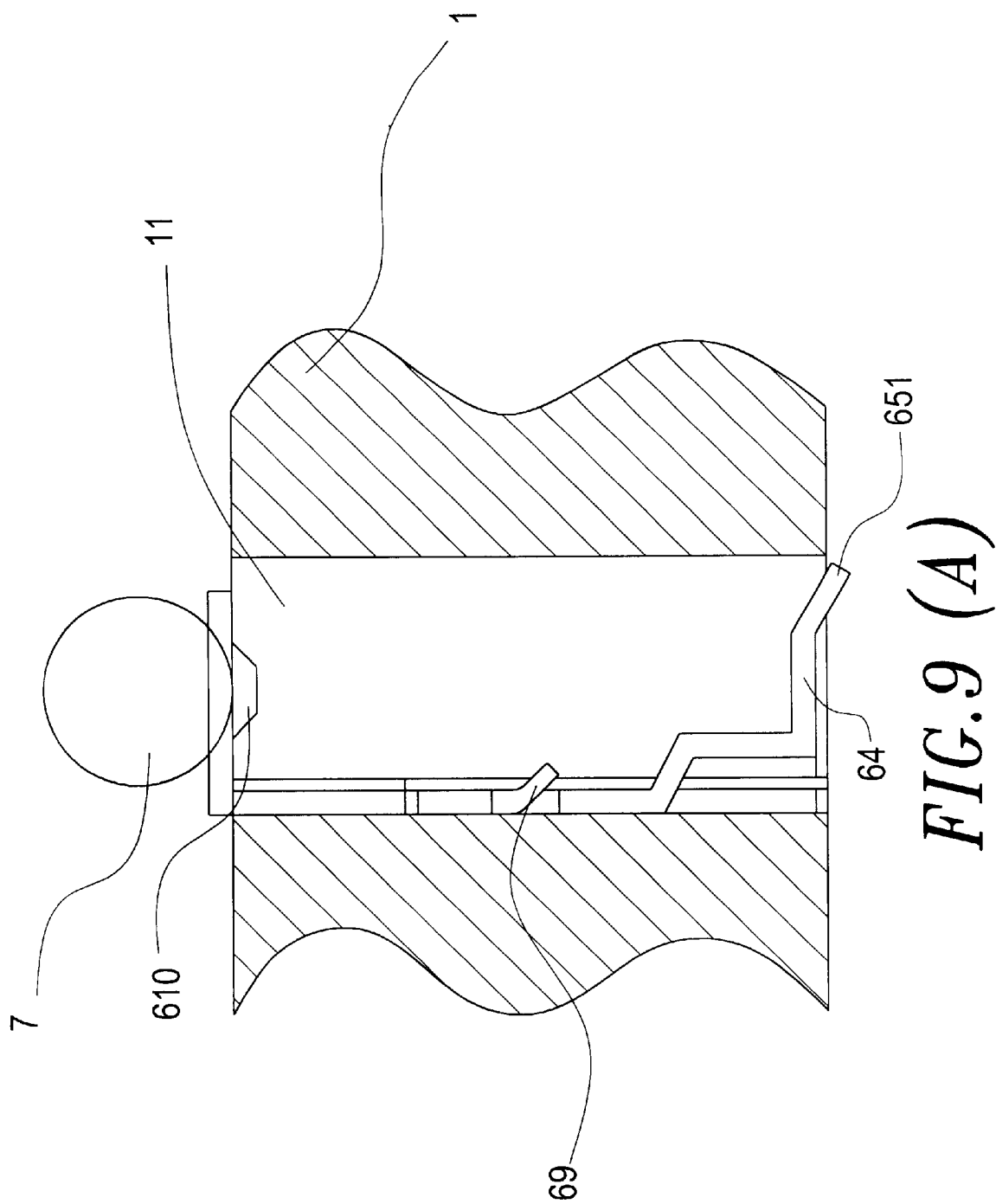
FIG. 9 is a sectional view, partially cut away, of the first exemplary embodiment of the terminal of the present invention.

Referring to FIG. 5–FIG. 7, the connecting socket and terminal structure of the present invention comprises a base 1, a handle 2, a movable cover 3, a protective cover 4, and a holding tool 5, a plurality of terminals 6, and a plurality of tin balls 7. As FIG. 8 and FIG. 9 illustrate, a plurality of receiving holes 11 arc provided for respectively receiving a line of terminals 6. A clipping rail 12 is formed at one end of a base 1, while a clipping clasp 31 having an inclined surface 311 at a front end is provided on a movable cover 3. When the clipping clasp 31 of the movable cover 3 is clipped by the clipping rail 12, the base 1 and the movable cover 3 can be securely combined.

A repairing hole 111 is formed near the clipping rail 12 in the base to extend toward the nearest edge for visible access to the clipping clasps 31 of the movable cover 3 (as shown in FIG. 7) therethrough. Thus, a holding tool 5 can be inserted into each repairing hole 111 near a clipping rail 12, such that the guide inclined arc 511 at the front portion of the tool's holding bars 51 engage the inclined surfaces 311 of the clipping clasps 31. In this way, the clipping clasps 31 can be pried loose from engagement with the clipping rails to free the movable cover 3 to be detached from the base 1.

Fillisters 32 are formed at both sides of the movable cover 3 to clip with clipping claws 41 of the protective cover 4. The upper middle surface of the protective cover 4 defines a flat plane 42, and a plurality of inclined arc parts 43 (having inclined or arced surface contour) surround the flat plane. A pushing part 44 is formed between the clipping claws 41 at opposed sides. The clipping claws 41 and the pushing parts 44 arc symmetrically formed at the opposed sides such that the protective cover can be assembled with the movable cover 3 in either of two orientations angularly of set one from the other by 180 degrees.

The protective cover 4 is configured to fully cover the guide holes 33 of the movable cover 3, so as to prevent dust and miscellaneous articles from entering. The flat plane 42 is where a vacuum device may aspirate against during automated assembly to position the connecting socket. The surrounding inclined arc parts 43 serve to deflect away and thereby reduce attachment of dust and washing liquid. The handle 2 can be opened and pushed to pushing part 44 to make the protective cover 4 detach from the movable cover 3. The protective cover 4 can be reused and recycled to protect as necessary.

Referring to FIG. 8 and FIG. 9, a connecting part 62 of the terminal 6 is extended from a material belt 61, and a cutting part 63 is extended from the connecting part 62 toward the direction of the terminal 6 such that the cutting part can be detached from the material belt 61 smoothly after the terminal is assembled. The connecting part 62 is enlarged and the contacting arm 64 and contacting part 65 are adapted to the shearing method. The connecting part 62 has enough width to be vertical to the fastening part 66, and thus has sufficient bearing tolerance to receive many terminals 6 arranged in a row and pressed into the grooves 13 of the receiving holes 11 tightly at one time. A staggering space 67 is formed by bending the connecting part 62 and the contacting arm 64 to have a distance from each other to give the opposed contacting arm 64 and the contacting part 65 better elastic effect. The contacting arms 64 arc bent inward to form an inclined arc part 68 such that the contacting arms 64 and contacting parts 65 have the required size and clipping force.

The contacting part 65 has an inclined shape 651 extending upward or downward (as shown in FIG. 9A), which increases the area of frictional contact with pins of an integrated circuit, and thereby increase useful life. The downward inclined shape 651 provides forward push force and backward resistance while the upward incline shape 651 provides forward resistance and backward push force. A pair of elastic fastening parts 69 are formed at a middle portion of both sides of the terminal 6, and a tin ball position part 610 extends downward to receive the soldered tin ball 7 with multi-point contact such that multi-point welding can be performed.

Figure 10:
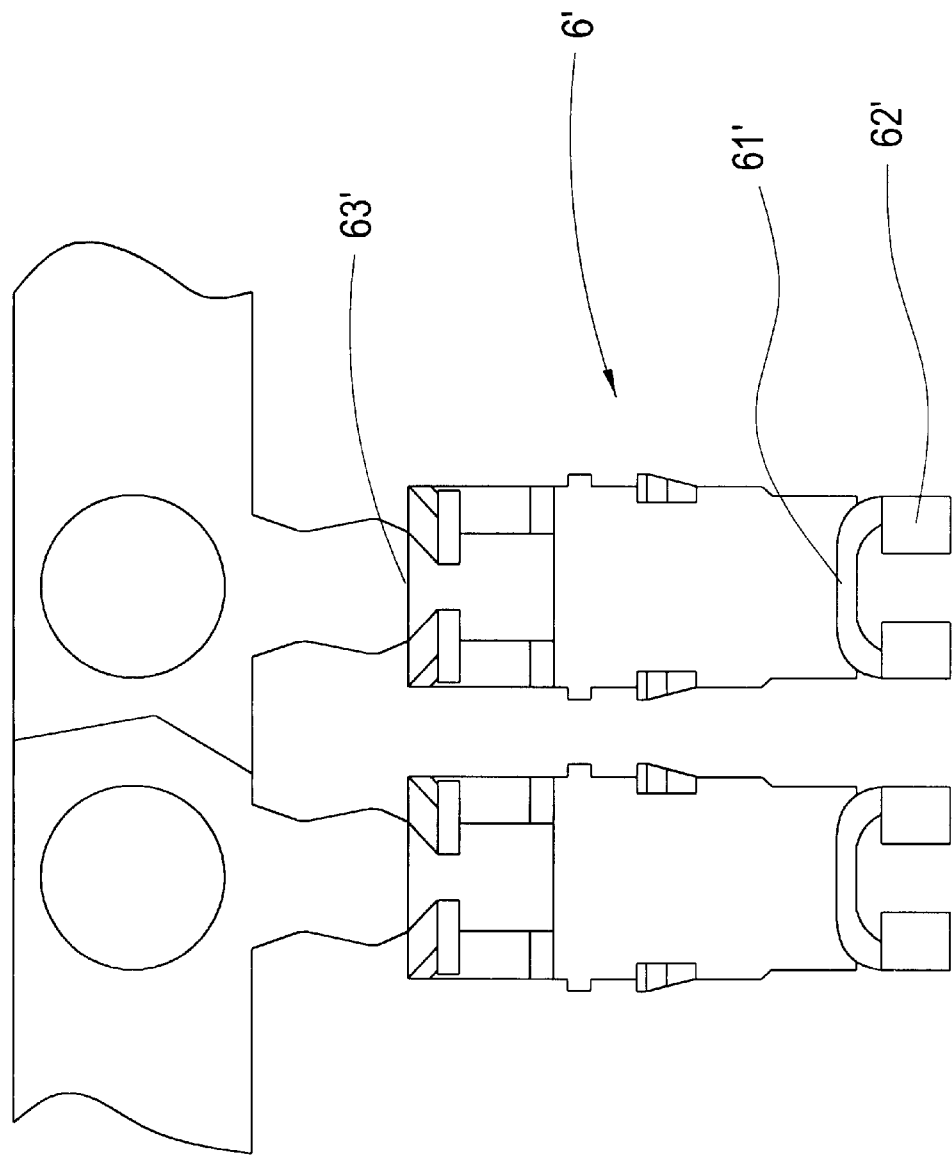
FIG. 10 is a diagram of a second exemplary embodiment of the terminal of the present invention.
Figure 11:
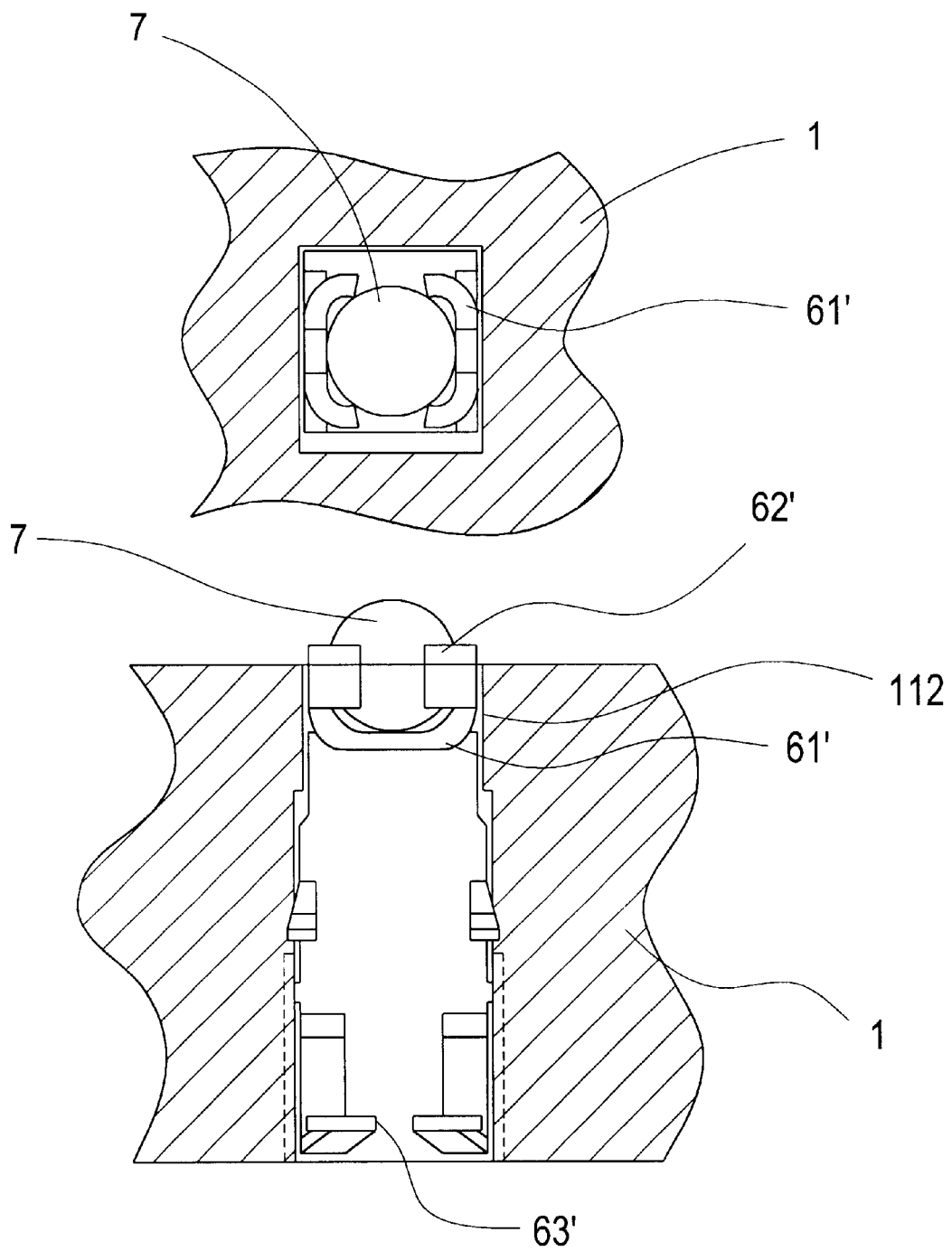
FIG. 11 shows sectional views of the second exemplary embodiment of the terminal of the present invention.

Referring to FIG. 10 and FIG. 11, which illustrate a second exemplary embodiment of a terminal structure of the present invention, a concave area 60' is formed at a lower portion of the terminal. A clipping part 61' is formed with both sides being bent inward, and blocking parts 62' formed at their ends. The tin ball can be positioned by moving upward, and the blocking parts 62' can prevent the soldering tin composition from attaching to the contacting part 63', such that a siphonal phenomenon may be avoided.

Additionally, the clipping part 112 inside the receiving hole 11 of the base 1 may operate in conjunction with the clipping part 61' to clip and position the tin ball 7 steadily.

Figure 12:
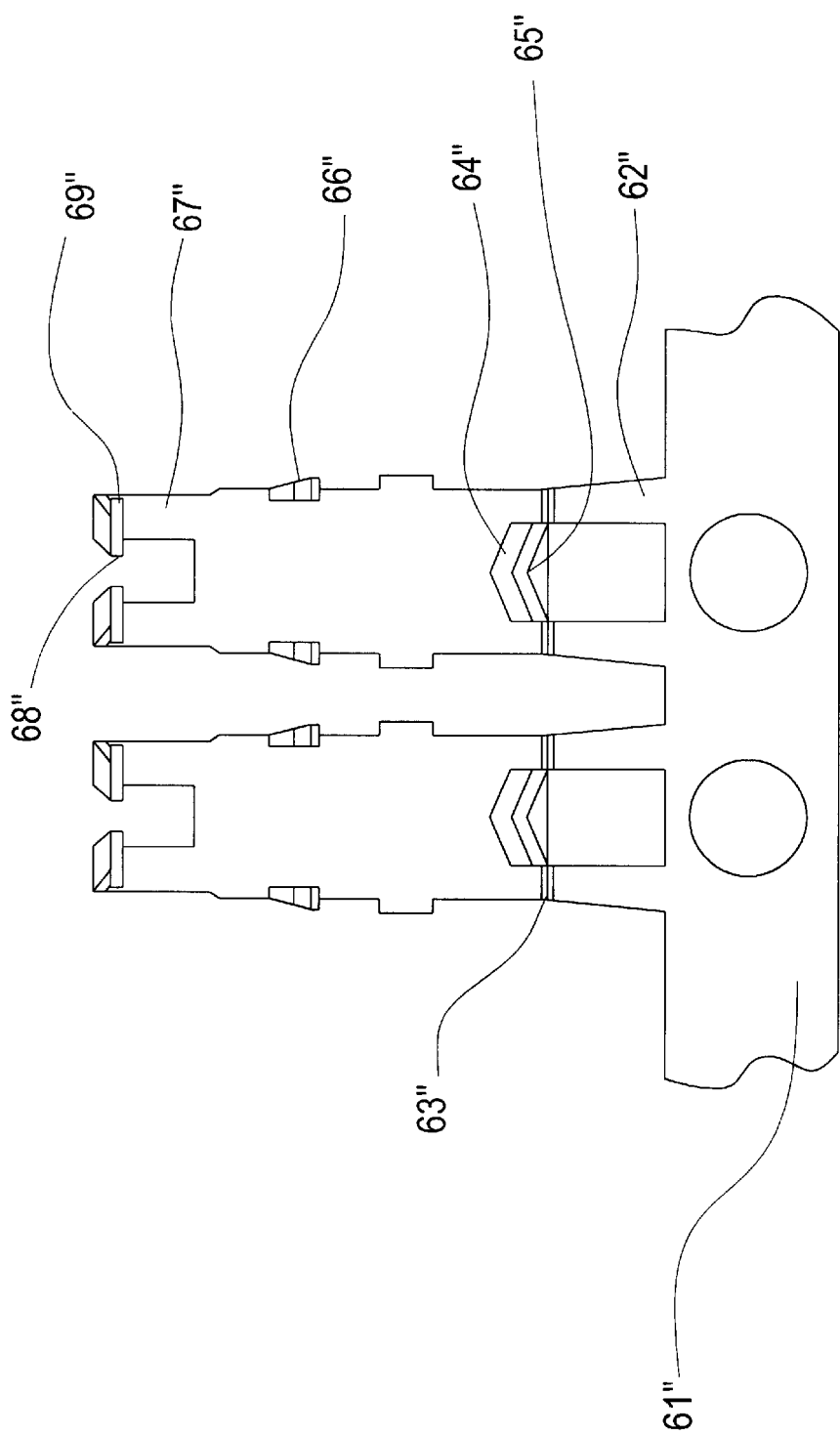
FIG. 12 is a diagram of a third exemplary embodiment of the terminal of the present invention.
Figure 13:
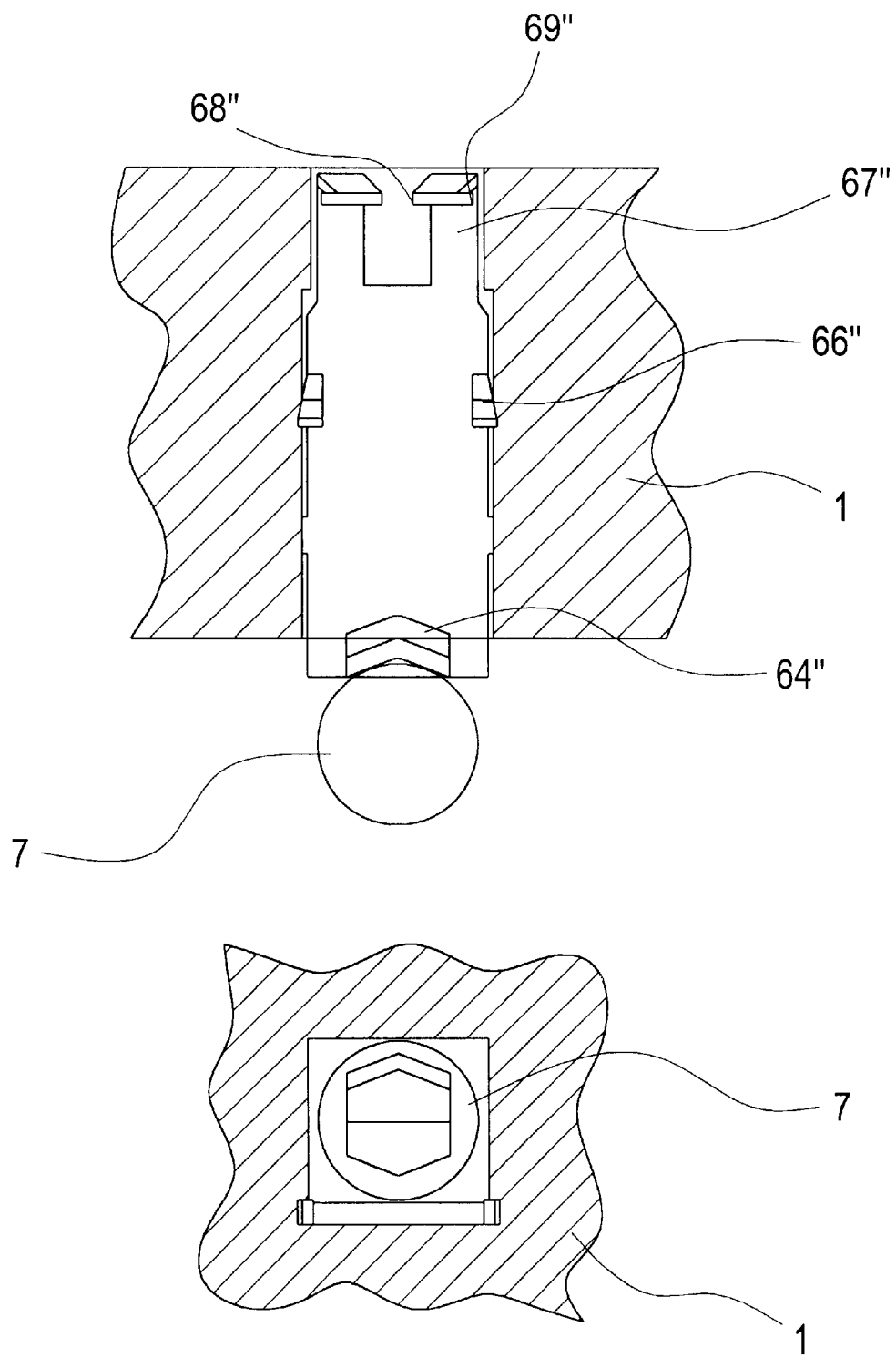
FIG. 13 shows sectional views of the third exemplary embodiment of the terminal of the present invention.

Referring to FIG. 12 and FIG. 13, which illustrate a third exemplary embodiment of the terminal structure of the present invention, the material belt 61" has a connecting part 62" extending upward at both sides with a width dimension tapering away from the material belt 61". The connection portion of the connecting part 62" and the terminal 6" defines a weak portion, which works in cooperation of cutting part 63" to cut off the material belt 61" at the weak portion and the cutting part 63". A tin ball position part 64" and a multi-point soldering part are formed inside the connecting part 62", and the shearing method is used between the connecting part 62" and the tin ball position part 64". Both sides of the tin ball position part 64" are bent to form a convex area 65" for positioning the tin ball 7 for multi-point soldering. Elastic holding parts 66" are formed at higher positions than the tin ball position parts 64", and a pair of contacting arms 67" and contacting parts 68" are extended upward. The contacting parts 68" become larger in size along the direction toward the contacting arms 67" to disperse elastic effect A block 69" is formed at each contacting part 68" to control the distance resulting from deflection of the contacting parts 68".

As described above, the connecting seat and related terminal structure of the present invention have the following advantages:

1. The arrangement of the base and the clipping rail of the connecting socket and the terminal structure thereof of the present invention are such that the clipping clasp of the movable cover can be held open and away from clipping the clipping rail such that it is easy to detach the movable cover from the base.
2. The upper middle surface of the protective cover of the connecting socket and terminal structure thereof of the present invention is a flat plane, which serves as the place aspirated by a vacuum device for positioning the connecting socket, while the inclined or arced surface contour of the part surrounding the flat plane deflects against attachment of miscellaneous articles or objects and washing liquid.
3. In the connecting socket and terminal structure thereof of the present invention, the clipping claws extending from the bottom and the pushing parts extending from the sides of the protective cover are symmetrically disposed at opposed sides such that the protective cover can be assembled with the movable cover in either of two orientations, Moreover, the protective cover may be detached from the movable cover after a handle is manipulated.
4. The protective cover of the connecting socket and terminal structure thereof of the present invention can completely cover the guide holes of the movable cover to prevent miscellaneous articles or objects from dropping into the guide holes, thereby preserving quality.
5. In the connecting socket and terminal structure thereof of the present invention, the connecting part of the terminal is sufficiently contoured and dimensioned, and the contacting arm and the contacting part are adapted to the manufacturing method of shearing. The connecting part has enough width and is vertical to the fastening part to have enough bearing capability to receive a row of multiple terminals pressed into corresponding grooves of the receiving holes of the base tightly at one time.
6. In the connecting socket and terminal structure thereof of the present invention, the connecting part of the terminal and the contacting arm arc bent apart from each other to form a staggered space such that the pair of opposite contacting arms and contacting parts provide good elastic effect.
7. In the connecting socket and terminal structure thereof of the present invention, the contacting arm of the terminal is bent inward to form the inclined arc part such that opposed pairs of contacting arms and contacting parts are configured with the required size and clipping force.
8. In the connecting socket and terminal structure thereof of the present invention, a tin ball positioning part, which can receive a tin ball for multi-point soldering, is extended from the lower part of the terminal such that the soldering can be performed at low temperature. Such the multi-point soldering method increases the security and stability of the resulting joint.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A connecting socket and a terminal structure thereof, comprising a base, a plurality of terminals, a handle, a movable cover, a protective cover, a holding tool and a plurality of tin balls, a clipping rail being disposed at an edge of said base and a clipping clasp being disposed opposite to said clipping rail on said movable cover, a repairing hole extending laterally inward from said edge of said base to provide open lateral access to said clipping clasp and clipping rail;

an enlarged connecting part being disposed between said terminals and a material belt, a pair of inclined arc contacting arms being disposed at a lower portion of said connecting part and extended inward to form a pair of opposed contacting parts each having an inclined arc configuration, a block part being disposed outside said contacting arms, an angled concave area being disposed at a lower portion of said terminal, a clipping part being defined at a portion of said terminal.

2. A connecting socket and a terminal structure thereof as recited in claim 1, wherein said clipping rail is clipped with said clipping clasp of said movable cover, and said holding tool can be inserted from a lateral side to deflect said clipping rail and said clipping clasp away from each other.

3. A connecting socket and a terminal structure thereof as recited in claim 1, wherein an area surrounding said protective cover is an inclined arc part.

4. A connecting socket and a terminal structure thereof as recited in claim 1, wherein a pair of pushing parts are set at both sides of said protective cover such that said handle can be pushed to depart in both directions, said clipping clasps being opposite such that said movable cover can be combined in both directions.

5. A connecting socket and a terminal structure thereof as recited in claim 1, wherein said holding tool has a pair of holding bars each having a guide inclined arc.

6. A connecting socket and a terminal structure thereof as recited in claim 1, wherein said connecting part of said terminal is formed by a shearing method.

7. A connecting socket and a terminal structure thereof as recited in claim 1, wherein said enlarged connecting part of said terminal is vertical to said holding part.

8. A connecting socket and a terminal structure thereof as recited in claim 1, wherein said angled concave area of said terminal positions at least one of said tin balls for multi-point soldering.

9. A connecting socket and a terminal structure thereof as recited in claim 1, wherein said blocking part outside said contacting part is enlarged gradually toward said contacting arm.

10. A connecting socket and a terminal structure thereof as recited in claim 1, wherein said tin ball is received by said clipping part of said terminal in cooperation with receiving holes of said holding part.

11. A connecting socket and a terminal structure thereof as recited in claim 1, wherein said contacting part is formed with one of an upward inclined arc or downward inclined arc.

12. A connecting socket and a terminal structure thereof as recited in claim 1, wherein an outside of said clipping part of said terminal is bent inward.

13. A connecting socket and a terminal structure thereof as recited in claim 1, wherein a bottom of said terminal is formed by shearing such that a positioning part is formed at a middle and said connecting parts at opposing sides are enlarged toward said material belt.

14. A connecting socket and a terminal structure thereof as recited in claim 1, wherein a middle zone of said pair of connecting parts of said terminal are bent to serve as a tin ball positioning part.

15. A connecting socket and a terminal structure thereof, comprising a base, a plurality of terminals, a handle, a movable cover, a protective cover, a holding tool and a plurality of tin balls, a clipping rail being disposed at an edge of said base and a clipping clasp being disposed opposite to said clipping rail on said movable cover, an enlarged connecting part being disposed between said terminals and a material belt, a pair of inclined arc contacting arms being disposed at a lower portion of said connecting part and extended inward to form a pair of opposed contacting parts each having an inclined arc configuration, a block part being disposed outside said contacting arms, an angled concave area being disposed at a lower portion of said terminal, a clipping part being defined at said lower portion of said terminal;

a middle zone of said pair of connecting parts of said terminal being bent to serve as a tin ball positioning part said tin ball positioning part being bent in two directions such tat said tin ball can be joined by multi-point soldering.

* * * * *